(12) United States Patent
Song et al.

(10) Patent No.: US 10,663,993 B2
(45) Date of Patent: May 26, 2020

(54) LOW-DROPOUT REGULATOR WITH BAND-REJECT POWER SUPPLY REJECTION RATIO FOR PHASE LOCKED LOOP VOLTAGE CONTROLLED OSCILLATOR

(71) Applicant: QUALCOMM Incorporated, San Diego, CA (US)

(72) Inventors: Tongyu Song, San Diego, CA (US); Jeffrey Mark Hinrichs, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 15/269,881

(22) Filed: Sep. 19, 2016

(65) Prior Publication Data

US 2018/0017982 A1 Jan. 18, 2018

Related U.S. Application Data

(60) Provisional application No. 62/363,098, filed on Jul. 15, 2016.

(51) Int. Cl.
| | | |
|---|---|---|
| *G05F 1/46* | (2006.01) |
| *H03L 7/099* | (2006.01) |
| *G05F 1/575* | (2006.01) |
| *H03L 1/00* | (2006.01) |
| *H04W 84/04* | (2009.01) |
| *H04W 84/12* | (2009.01) |

(52) U.S. Cl.
CPC .............. *G05F 1/468* (2013.01); *G05F 1/575* (2013.01); *H03L 1/00* (2013.01); *H03L 7/099* (2013.01); *H04W 84/042* (2013.01); *H04W 84/12* (2013.01)

(58) Field of Classification Search
CPC . G05F 1/56; G05F 1/562; G05F 1/565; G05F 1/569; G05F 1/571; G05F 1/573; G05F 1/5735; G05F 1/575; G05F 1/585; G05F 1/59; G05F 1/595; G05F 1/461
USPC .................. 323/273–281, 303; 327/534–541
See application file for complete search history.

(56) References Cited

U.S. PATENT DOCUMENTS

| | | | | |
|---|---|---|---|---|
| 6,707,340 B1 * | 3/2004 | Gough | .................... | H03F 1/083 323/273 |
| 6,989,660 B2 * | 1/2006 | Mauthe | .................. | G05F 1/465 323/274 |
| 7,068,019 B1 * | 6/2006 | Chiu | ....................... | G05F 1/575 323/273 |

(Continued)

OTHER PUBLICATIONS

Caves J.T., et al., "Sampled Analog Filtering Using Switched Capacitors as Resistor Equivalents", IEEE Journal of Solid-State Circuits, Dec. 1, 1977, vol. 12, No. 6, XP055407623, ISSN: 0018-9200, DOI:10.1109/JSSC.1977.1050966, pp. 592-599.

(Continued)

*Primary Examiner* — Nguyen Tran
(74) *Attorney, Agent, or Firm* — Seyfarth Shaw LLP/QUALCOMM Incorporated

(57) ABSTRACT

A voltage regulator includes a band limited reference voltage. The band limited reference voltage is generated from a supply voltage combined with a feedback path to provide a band reject power supply rejection ratio (PSRR). The voltage regulator also includes a feedforward path to extend the band reject PSRR.

16 Claims, 9 Drawing Sheets

(56) References Cited

U.S. PATENT DOCUMENTS

| | | | |
|---|---|---|---|
| 7,068,094 B1 * | 6/2006 | Jamal | H02M 3/07 |
| | | | 327/536 |
| 8,305,056 B2 | 11/2012 | Wadhwa | |
| 9,000,857 B2 | 4/2015 | Lahiri et al. | |
| 2004/0051508 A1 * | 3/2004 | Hamon | G05F 1/565 |
| | | | 323/280 |
| 2006/0152206 A1 | 7/2006 | Yu | |
| 2009/0015299 A1 * | 1/2009 | Ryu | H03F 1/0211 |
| | | | 327/108 |
| 2014/0340058 A1 | 11/2014 | Wang | |
| 2016/0062376 A1 * | 3/2016 | Kim | G05F 1/575 |
| | | | 323/280 |
| 2016/0195883 A1 | 7/2016 | Aboudina et al. | |

OTHER PUBLICATIONS

Chen L., et al., "High-PSR CMOS LDO with Embedded Ripple Feedforward and Energy-Efficient Bandwidth Extension", 28th IEEE International System-On-Chip Conference, Sep. 8, 2015, XP032863916, DOI: 10.11 09/SOCC.2015.7406988, [retrieved on Feb. 12, 2016], pp. 384-389.

Guo J., et al., "A 25mA CMOS LDO with −85dB PSRR at 2.5MHZ", IEEE Asian Solid-State Circuits Conference, Nov. 11, 2013, XP032535332, DOI: 10.1109/ASSCC.2013.6691062, ISBN: 978-1-4799-0277-4, pp. 381-384.

International Search Report and Written Opinion—PCT/US2017/039276—ISA/EPO—dated Sep. 28, 2017.

Nozahi-Ei M., et al., "High PSR Low Drop-Out Regulator with Feed-Forward Ripple Cancellation Technique", IEEE Journal of Solid-State Circuits, Mar. 2010, vol. 45, No. 3, pp. 565-577.

* cited by examiner

LOW-DROPOUT REGULATOR WITH BAND-REJECT POWER SUPPLY REJECTION RATIO FOR PHASE LOCKED LOOP VOLTAGE CONTROLLED OSCILLATOR

CROSS-REFERENCE TO RELATED APPLICATION

The present application claims the benefit of U.S. Provisional Patent Application No. 62/363,098, filed on Jul. 15, 2016, and titled "LOW-DROPOUT REGULATOR WITH BAND-REJECT POWER SUPPLY REJECTION RATIO FOR PHASE LOCKED LOOP VOLTAGE CONTROLLED OSCILLATOR," the disclosure of which is expressly incorporated by reference herein in its entirety.

BACKGROUND

Technical Field

The present disclosure relates generally to wireless communication systems, and more specifically, to methods and devices for reducing noise within a phased-locked loop (PLL).

Background

Phase locked loops (PLLs) are commonly used in telecommunications, computers and other electronics that utilize a precise clock for coordinating and synchronizing activities. PLLs can provide a local oscillator (LO) function in a radio receiver or transmitter. PLLs are also used for clock-signal distribution and noise reduction, as well as the clock source for high-sampling-rate analog-to-digital or digital-to-analog conversion.

A phase locked loop (PLL) forces an oscillator (e.g., voltage controlled oscillator (VCO) or digitally controlled oscillator (DCO)) to replicate or track a reference frequency and phase at an input when the PLL is in a lock configuration. When locked, the frequencies of the input (e.g., at a phase detector) and output (e.g., at a VCO) are tracked exactly (e.g., input frequency=output frequency). The VCO is often the main contributor to PLL noise due to degradation from source voltage noise. The overall power supply noise rejection (PSNR) of a PLL is a bandpass transfer function, and its center frequency is close to a PLL bandwidth.

As noise performance of PLLs improves, the impact of power supply noise is becoming increasingly evident, and may even limit noise performance in some cases. Accordingly, reducing noise within PLLs is desirable.

SUMMARY

In an aspect of the present disclosure, a voltage regulator includes a band limited reference voltage. The band limited reference voltage is generated from a supply voltage combined with a feedback path to provide a band reject power supply rejection ratio (PSRR). The voltage regulator also includes a feedforward path to extend the band reject PSRR.

In another aspect of the present disclosure, a voltage regulator circuit includes a divider and a low pass filter to generate a reference voltage. The voltage regulator circuit also includes a feedback path. The voltage regulator circuit further includes a feedforward path.

In yet another aspect of the present disclosure, a method of removing noise with a voltage regulator includes generating a band limited reference voltage. The band limited reference voltage is generated from a supply voltage combined with a feedback path to provide a band reject power supply rejection ratio (PSRR). The method further includes extending the band reject PSRR with a feedforward path.

In still another aspect of the present disclosure, an apparatus for removing noise using a voltage regulator is presented. The apparatus includes means for generating a band limited reference voltage from a supply voltage that is combined with a feedback path to provide a band reject power supply rejection ratio (PSRR). The apparatus also includes means for extending the band reject PSRR with a feedforward path.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

Aspects and features of the present disclosure will be more apparent by describing example aspects with reference to the accompanying drawings, in which.

DETAILED DESCRIPTION

Figure 1:
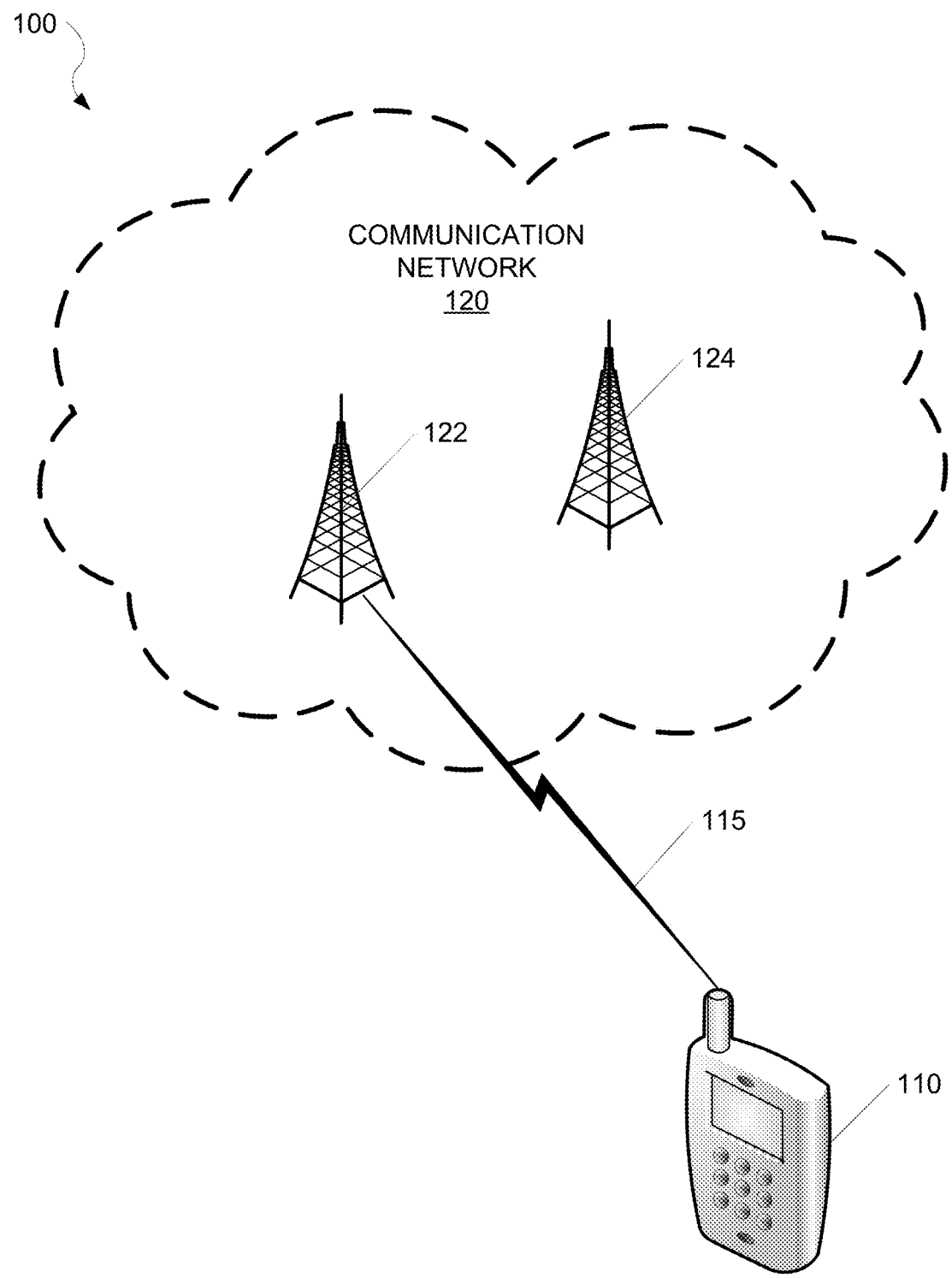
FIG. 1 is a system diagram illustrating a network environment according to various aspects of the present disclosure.

While a number of aspects are described herein, these aspects are presented by way of example only, and are not intended to limit the scope of protection. The apparatuses and methods described herein may be embodied in a variety of other forms. Furthermore, various omissions, substitutions, and changes in the form of the example apparatuses and methods described herein may be made without departing from the scope of protection.

The term "couple" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

A phase locked loop (PLL) circuit is often an important component of a device that is designed to operate in a wireless communication system. The PLL forces the voltage controlled oscillator (VCO) to replicate and track a reference frequency and phase at an input when the PLL is in lock configuration. When locked, the frequencies of the input (e.g., at a phase detector) and output (e.g., at a VCO) are tracked exactly (e.g., input frequency=output frequency). A phase offset, however, may exist between the input and output.

A PLL reference frequency may be derived from a local oscillator (e.g., crystal oscillator, (XO)). For example, a frequency of the crystal oscillator may be around tens of megahertz (MHz) while a frequency of the VCO may be specified to generate a periodic signal in the GHz range. In this case, a frequency divider by N is interposed between the VCO and the phase detector. When locked, the frequency at an output of the PLL (e.g., at a VCO) is tracking exactly at N times the frequency at an input of the PLL (e.g., at a phase detector). For example, N*input frequency is equal to the output frequency. Thus, the output frequency of the VCO is set at a fractional multiple of the input frequency by the frequency divider. Accordingly, the frequency divider modulus control might be scrambled by a digital delta-sigma modulator (DSM). The VCO output may be used as a local oscillator or to generate a clock signal for a digital system.

The phase detector may be coupled to a loop filter and the loop filter may be coupled to the VCO. The VCO may be coupled to the frequency divider. The frequency divider may be coupled to the phase detector, thus forming the feedback loop (closed loop). The output of the VCO may be a frequency sinusoid that is controlled by a tuning voltage, Vtune, which is received by the VCO from the loop filter. For example, changing the tuning voltage changes the frequency of the VCO. To synthesize a desirable or exact frequency of the VCO, the VCO is included in the closed loop to feed back the VCO signal to the frequency divider. The phase detector compares an output of the frequency divider with a signal that is generated by the local oscillator.

For example, if the reference frequency of the crystal oscillator is at 40 MHz and the output of the VCO is at 4 GHz, the frequency divider receives the 4 GHz output of the VCO and is programmed to divide by 100 to provide an output frequency to the phase detector that matches the reference frequency received at the phase detector. The phase detector compares a phase of the reference frequency and the output frequency of the frequency divider and generates an error signal, proportional to a phase difference between the two frequencies. In some implementations, an analog multiplier or mixer may be used as a phase detector. Because the reference frequency and the output from the frequency divider are the same when the loop is locked, the output of the phase detector contains a direct current (DC) component and a signal at twice the frequency. The DC component is proportional to the phase difference. The double frequency component is removed by the low pass filter. Any phase difference then shows up as a control voltage (e.g., tuning voltage (Vtune)) to the VCO after filtering.

A gain calibrator and delay calibrator may be coupled to the PLL to provide a gain calibration signal to the VCO and a delay calibration signal to the frequency divider. For example, the gain calibrator receives an error signal from a phase to digital converter (PDC). The error signal may be based on a difference in phase between the reference signal and the output signal from the frequency divider. A gain correlator at the gain calibrator correlates the error signal with a gain calibration signal and determines a gain associated with the correlation. The determined gain or a product of the determined gain and the gain calibration signal are provided to the VCO to calibrate the gain of the VCO. The delay calibrator receives the error signal from the phase to digital converter (PDC). A delay correlator at the delay calibrator correlates the error signal with a delay calibration signal and determines a delay coefficient. The delay coefficient and the delay calibration signal are provided to a filter (e.g., finite impulse response filter) in the delay calibrator. A filtered delay calibration signal is then provided to the frequency divider to calibrate the frequency divider. The filtered delay calibration signal may be provided to the frequency divider via a delta sigma modulator.

FIG. 1 is a system diagram illustrating a network environment 100 according to various aspects. A communication network 120 may include one or more evolved universal mobile telecommunications system (UMTS) terrestrial radio access (E-UTRA) Node Bs (eNodeBs) including, for example, but not limited to, a first eNodeB 122 and a second eNodeB 124. The communication network 120 may be, for example, but not limited to, a wireless or mobile communication network.

The communication network 120 may be an LTE communication network. However, a person having ordinary skill in the art may appreciate that the communication network 120 may support different and/or additional radio access technologies (RATs), including, for example, but not limited to, wideband code division multiple access (WCDMA), global system for mobile communications (GSM), and time division-synchronous code division multiple access (TD-SCDMA) without departing from the scope of the present disclosure.

A mobile communication device 110 may communicate with the communication network 120 on a subscription 115 via the first eNodeB 122. For example, the mobile communication device 110 may transmit data to and receive data from the communication network 120 via the first eNodeB 122. A person having ordinary skill in the art may appreciate that the mobile communication device 110 may communicate with the communication network 120 on the subscription 115 via a different eNodeB (e.g., the second eNodeB 124) without departing from the scope of the present disclosure. Moreover, a person having ordinary skill in the art may appreciate that the mobile communication device 110 may communicate with different and/or additional communication networks on the subscription 115 and/or a different subscription without departing from the scope of the present disclosure.

Figure 2:
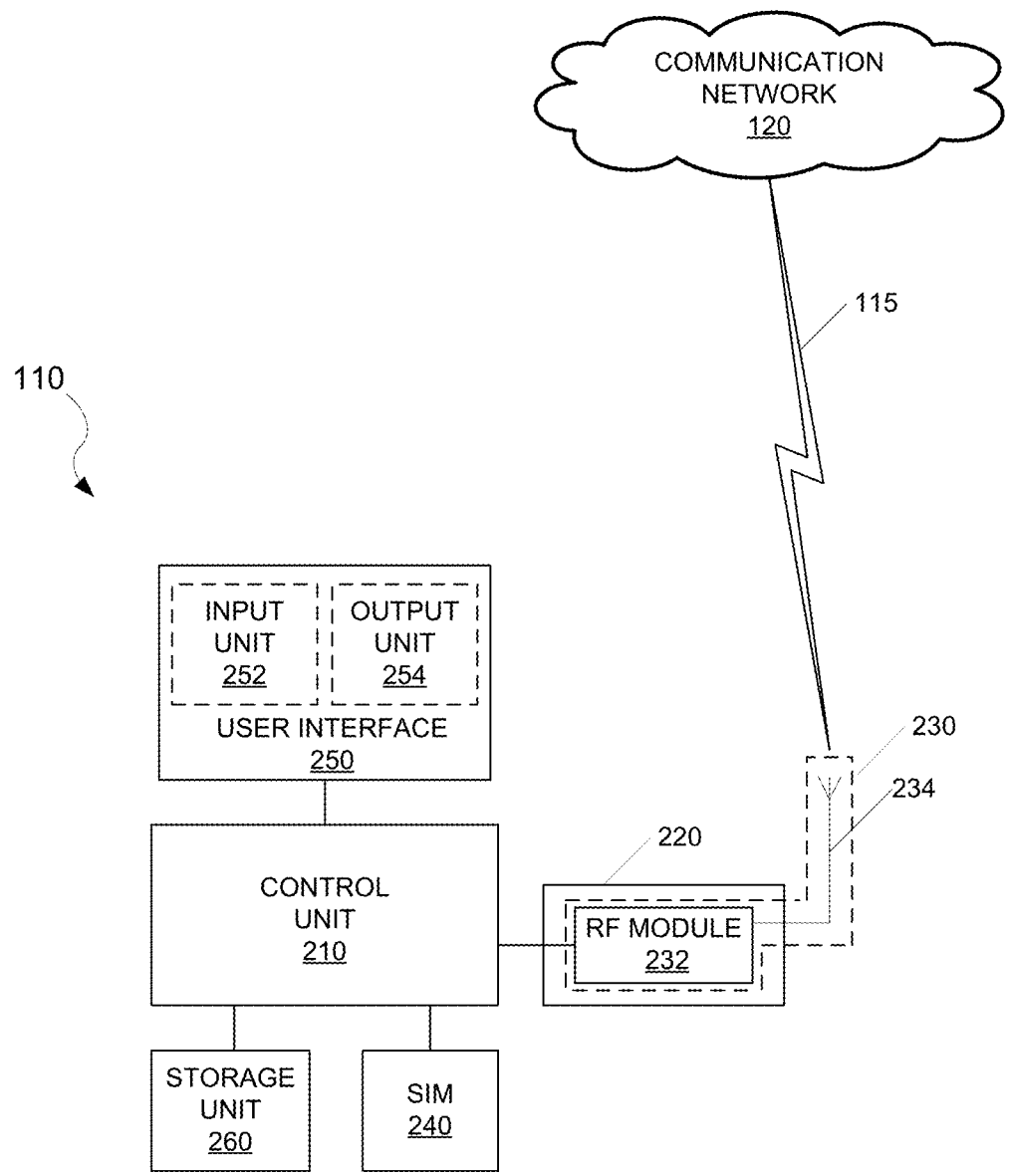
FIG. 2 is a block diagram illustrating a mobile communication device according to various aspects of the present disclosure.

FIG. 2 is a block diagram illustrating a mobile communication device 110 according to various aspects. Referring to FIGS. 1 and 2, the mobile communication device 110 may include a control unit 210, a communication unit 220, a subscriber identity module (SIM) 240, a user interface 250, and a storage unit 260.

The mobile communication device 110 may be any device capable of wirelessly communicating with one or more communication networks including, for example, but not limited to, the communication network 120. The mobile communication device 110 may be, for example, but not limited to, a smartphone, a tablet PC, or a laptop computer.

The SIM 240 may associate the communication unit 220 with the subscription 115 on the communication network 120. Although the mobile communication device 110 is shown to include a single SIM (e.g., the SIM 240), a person having ordinary skill in the art may appreciate that the mobile communication device 110 may include additional SIMS without departing from the scope of the present disclosure. The additional SIMS may associate the communication unit 220 with a different subscription on the communication network 120 or a different communication network.

The SIM 240 may be a universal integrated circuit card (UICC) that is configured with SIM and/or universal SIM (USIM) applications, enabling access to GSM and/or UMTS networks. The UICC may also provide storage for a phone book and other applications. Alternatively, in a CDMA network, a SIM may be a UICC removable user identity module (R-UIM) or a CDMA subscriber identity module (CSIM) on a card. A SIM card may have a central processing unit (CPU), read-only memory (ROM), random-access memory (RAM), electrically erasable programmable read-only memory (EEPROM) and input/output (I/O) circuits. An integrated circuit card identity (ICCID) SIM serial number may be printed on the SIM card for identification. However, a SIM may be implemented within a portion of memory of the mobile communication device 110, and thus need not be a separate or removable circuit, chip, or card.

The communication unit 220 may include an RF chain 230. The RF chain 230 may include, for example, but not limited to, an RF module 232 and an antenna 234. Although the mobile communication device 110 is shown to include a single communication unit (e.g., the communication unit 220), a person having ordinary skill in the art may appreciate that the mobile communication device 110 may include additional communication units without departing from the scope of the present disclosure.

The user interface 250 may include an input unit 252. The input unit 252 may be, for example, but not limited to, a keyboard or a touch panel. The user interface 250 may further include an output unit 254. The output unit 254 may be, for example, but not limited to, a liquid crystal display (LCD) or a light emitting diode (LED) display. A person having ordinary skill in the art will appreciate that other types or forms of input and output units may be used without departing from the scope of the present disclosure.

The control unit 210 may be configured to control the overall operation of the mobile communication device 110 including controlling the functions of the communication unit 220 including, for example, but not limited to, frequency synthesis performed by the RF module 232. The control unit 210 may be, for example, but not limited to, a microprocessor (e.g., general-purpose processor, baseband modem processor, etc.) or a microcontroller.

The storage unit 260 may be configured to store application programs, application data, and user data. At least some of the application programs stored at the storage unit 260 may be executed by the control unit 210 for the operation of the mobile communication device 110.

Figure 3:
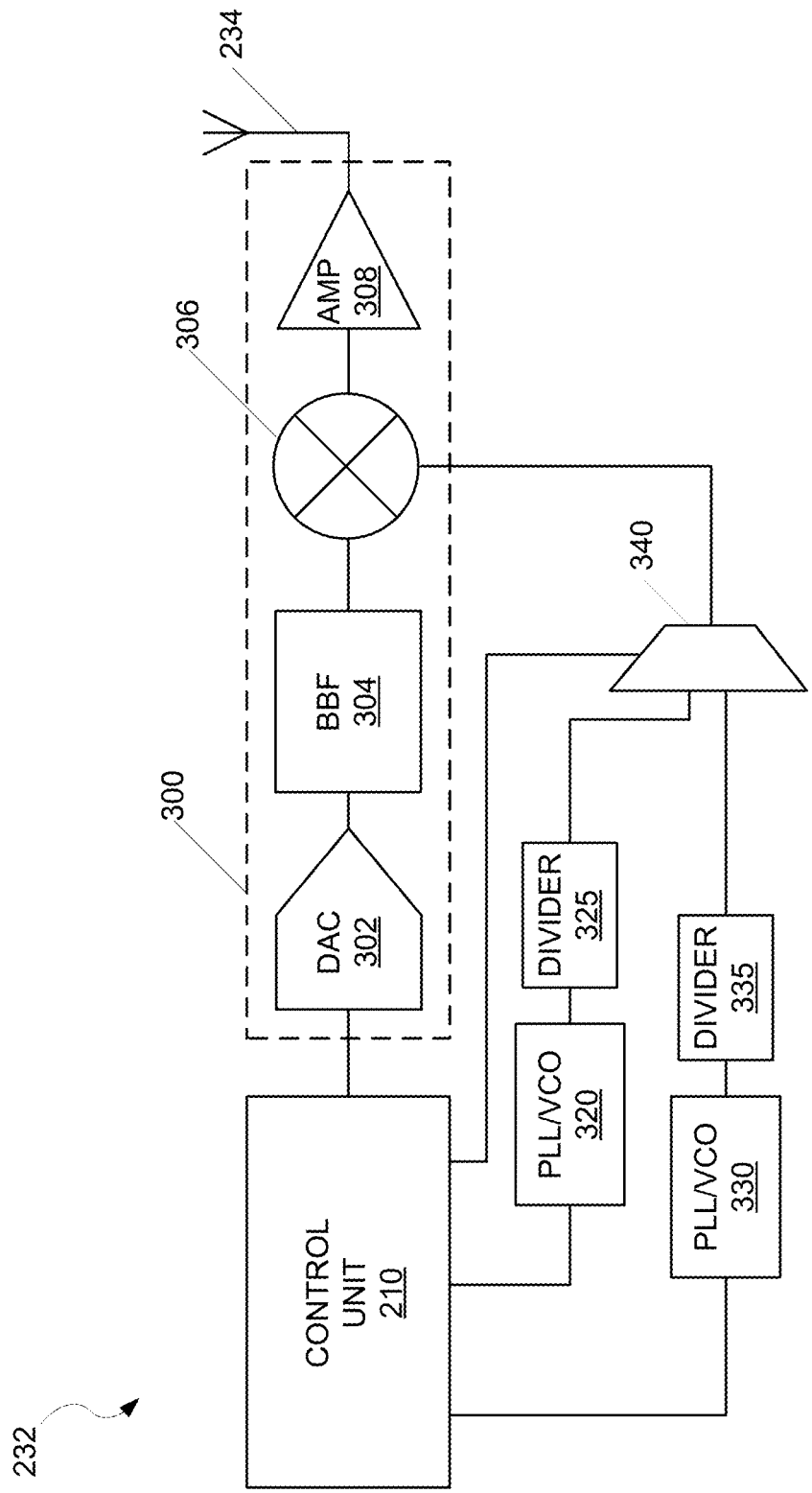
FIG. 3 is a block diagram illustrating a radio frequency (RF) module according to aspects of the present disclosure.

FIG. 3 is a block diagram illustrating the RF module 232 according to some aspects. Referring to FIGS. 1, 2, and 3, the RF module 232 may include a transmit path 300 and a PLL selector 340.

The RF module 232 may further include multiple local oscillators (LO). The oscillators may comprise multiple phase locked loops (PLLs) with corresponding voltage controlled oscillators (VCOs) (PLL/VCOs) including, for example, but not limited to, a first PLL/VCO 320 and a second PLL/VCO 330. According to one exemplary aspect, the RF module 232 may include two PLL/VCOs (e.g., the first PLL/VCO 320 and the second PLL/VCO 330).

The first PLL/VCO 320 may be coupled with a first divider 325. The first PLL/VCO 320 may receive a reference signal having a reference frequency $F_{ref}$ from the control unit 210 and output a signal to the first divider 325. The combination of the first PLL/VCO 320 and the first divider 325 may be configured to generate and output a frequency divided signal that is synchronized to the phase and the frequency (e.g., $F_{ref}$) of the reference signal.

The second PLL/VCO 330 may be coupled with a second divider 335. The second PLL/VCO 330 may receive a reference signal having a reference frequency $F_{ref}$ from the control unit 210 and output a signal to the second divider 335. The combination of the second PLL/VCO 330 and the second divider 335 may be configured to generate and output a signal that is synchronized to the phase and the frequency (e.g., $F_{ref}$) of the reference signal.

In one implementation, an output signal from a PLL/VCO may be an undivided output signal, thus allowing for the omission of dividers.

The mobile communication device 110 may be transmitting data to the communication network 120 via the transmit path 300 according to a current RB allocation. The control unit 210 may receive from the communication network 120 an upcoming RB allocation for the mobile communication device 110. For example, the control unit 210 may be notified of the upcoming RB allocation on the physical downlink control channel (PDCCH) in advance (e.g., 4-8 slot periods).

The upcoming RB allocation may be different from a current RB allocation. For example, the upcoming RB allocation may have a different bandwidth and/or frequency range than the current RB allocation. A single RB may have a bandwidth of about 180 kHz, but other bandwidths may be used.

In one aspect, in order for the mobile communication device 110 to transmit data according to the upcoming RB allocation, the control unit 210 may select one of the first PLL/VCO 320 and the second PLL/VCO 330 that is not currently in use. The control unit 210 may tune the selected one of the first PLL/VCO 320 and the second PLL/VCO 330 to a target frequency based on a bandwidth of the upcoming RB allocation (e.g., number of allocated RBs).

For example, if the bandwidth of the upcoming RB allocation is narrow (e.g., number of allocated RBs less than or equal to a threshold x, where x may be equal to 6 or another integer value), the control unit 210 may tune the selected one of the first PLL/VCO 320 and the second PLL/VCO 330 to a frequency corresponding to the allocated RBs (e.g., center frequency of the allocated RBs).

In one exemplary aspect, the control unit 210 may determine the frequency corresponding to the upcoming RB allocation based on a lookup table (LUT). For example, the control unit 210 may determine, based on the LUT, the target frequency to which to tune the selected one of the first PLL/VCO 320 and the second PLL/VCO 330 in order for the mobile communication device 110 to transmit data in accordance with the upcoming RB allocation. In various aspects, the LUT may provide correlations between one or more RB allocations (e.g., in each frequency band) and target frequencies to which to tune each PLL/VCO including, for example, but not limited to, the first PLL/VCO 320 and/or the second PLL/VCO 330.

Alternately, if the bandwidth of the upcoming RB allocation is not narrow (e.g., number of allocated RBs greater than x, where x may be equal to 6 or another integer value), the control unit 210 may tune the selected one of the first PLL/VCO 320 and the second PLL/VCO 330 to a frequency corresponding to an assigned channel (e.g., center frequency of assigned E-UTRA absolute radio frequency channel number (EARFCN)).

The control unit 210 may perform coarse tuning (CT) calibration on the selected one of the first PLL/VCO 320 and the second PLL/VCO 330 in order to achieve the target frequency (e.g., frequency corresponding to allocated RBs or to assigned EARFCN). In some aspects, the control unit 210 may perform CT calibration on the selected one of the first PLL/VCO 320 and the second PLL/VCO 330, and allow the selected one of the first PLL/VCO 320 and the second PLL/VCO 330 to settle to the target frequency. Alternately, in some aspects, the control unit 210 may perform CT calibration on the selected one of the first PLL/VCO 320 and the second PLL/VCO 330, and perform two-point modulation (TPM) to achieve the target frequency.

The PLL selector 340 may be configured to receive one or more control signals from the control unit 210. According to one exemplary aspect, the PLL selector 340 may select a frequency divided signal generated by the first PLL/VCO 320 and the first divider 325 or by the second PLL/VCO 330 and by the second divider 335 to output to the transmit path 300 based on the one or more control signals from the control unit 210. The control unit 210 may be configured to cause the PLL selector 340 to perform the switch while a first symbol (e.g., symbol #0) is transmitted by the mobile communication device 110 according to the upcoming RB allocation. Additionally, the switch may be performed during a transmission of a cyclic prefix (CP) of a symbol (e.g., symbol #0).

The transmit path 300 may include a digital to analog converter (DAC) 302 configured to receive a digital signal from the control unit 210 and convert the digital signal into an analog signal.

The transmit path 300 may further include a baseband filter (BBF) 304. The BBF 304 may be configured to receive the analog signal from the DAC 302. The BBF 304 may be further configured to receive one or more control signals from the control unit 210. Based on the one or more control signals from the control unit 210, the BBF 304 may be configured to modify a bandwidth of the analog signal received from the DAC 302 to produce a baseband signal (e.g., a filtered analog signal).

The transmit path 300 may include a mixer 306. The mixer 306 may be configured to modulate the frequency divided signal from the PLL selector 340 with the baseband signal from the BBF 304 to generate an up-converted signal. In some aspects, when the bandwidth of RB allocation is narrow (e.g., number of allocated RBs less or equal to x), the frequency divided signal from the PLL selector 340 may be at a frequency corresponding to the upcoming RB allocation (e.g., center frequency of upcoming RB allocation). Alternately, when the bandwidth of the RB allocation is not narrow (e.g., number of allocated RBs greater than x), the frequency divided signal from the PLL selector 340 may correspond to the assigned channel (e.g., center frequency of assigned EARFCN). The up-converted signal may have a frequency corresponding to the upcoming RB allocation (e.g., center frequency of upcoming RB allocation).

In various aspects, the BBF 304 may be configured to produce a baseband signal based on a specified frequency of the RB allocation and a tuned frequency of the frequency divided signal received at the transmit path 300 (e.g., from the PLL selector 340). For example, the frequency of the baseband signal generated by the BBF 304 may be adjusted such that modulating the baseband signal with the frequency divided signal generates an up-converted signal at the specified frequency of the upcoming RB allocation (e.g., center frequency of upcoming RB allocation).

The transmit path 300 may further include an amplifier 308. The amplifier 308 may be configured to amplify the up-converted signal from the mixer 306 for transmission.

The antenna 234 may receive the amplified signal from the amplifier 308 and transmit the amplified signal. For example, an amplified signal from the amplifier 308 may be transmitted to the communication network 120 (e.g., the first eNodeB 122 or the second eNodeB 124) on the subscription 115 via the antenna 234.

A person having ordinary skill in the art may appreciate that the RF module 232 may include additional and/or different components than shown in FIG. 3 without departing from the scope of the present disclosure. For example, although not shown, a person having ordinary skill in the art may appreciate that the RF module 232 may additionally include a receive path without departing from the scope of the present disclosure.

Aspects of the present disclosure are directed to the problem of phase locked loop (PLL) sensitivity in large system on chips (SOCs). As indicated above, noise from a voltage source VDD may degrade PLL phase noise, such as through a voltage controlled oscillator (VCO). The VCO VDD noise transfer function may be a band-pass signal. As a result, an LDO with a band reject transfer function may be used to offset and reduce the VCO VDD noise, thus improving PLL performance.

Figure 4:
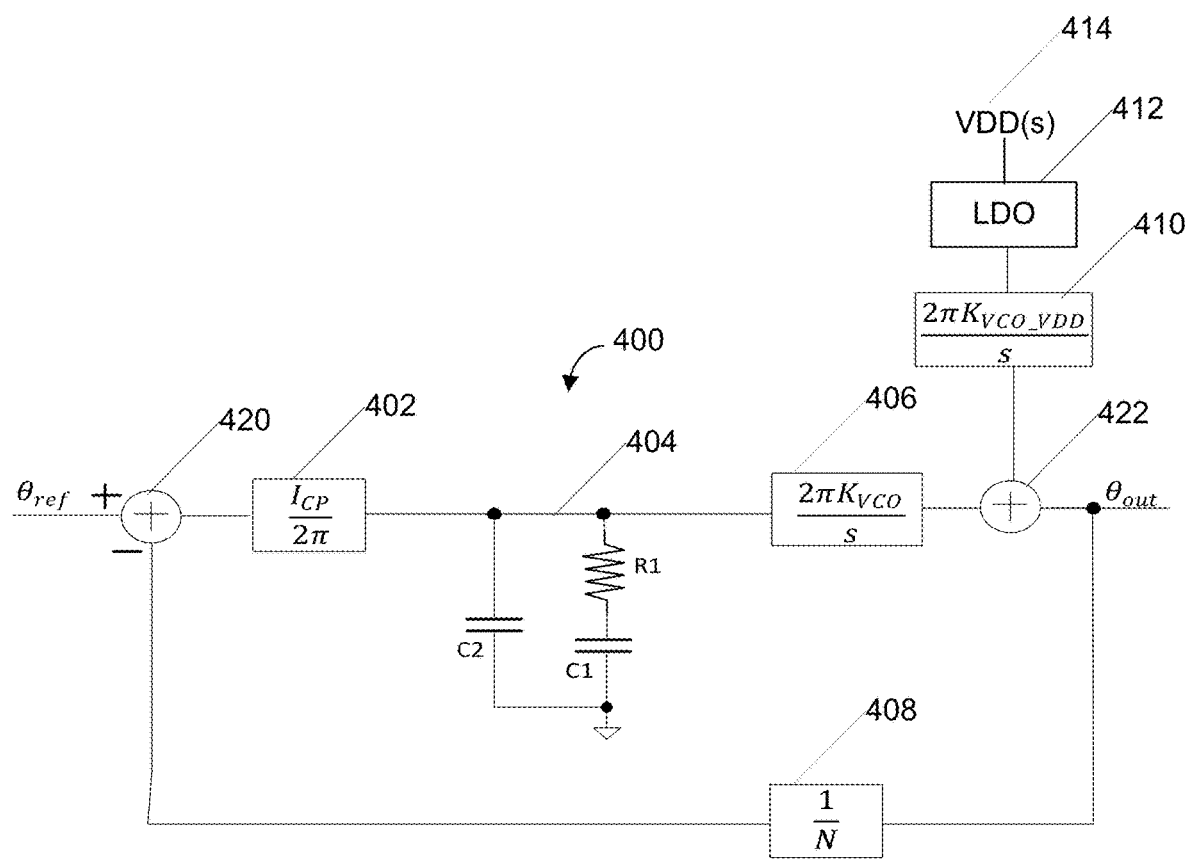
FIG. 4 is a block diagram illustrating a low-dropout regulator (LDO) coupled to a phase locked loop (PLL) according to aspects of the present disclosure.

FIG. 4 is a block diagram illustrating a low dropout regulator (LDO) coupled to a phase locked loop (PLL) 400 according to aspects of the present disclosure. A low-dropout regulator (LDO) 412 (e.g., a voltage regulator circuit of a RF front end module) may reduce VCO VDD noise in the PLL 400, and may be coupled with the PLL 400 through a second mixer 422. The LDO 412 may further be coupled to a voltage source 414 having a phase noise 410. The voltage source 414 may be part of a voltage controlled oscillator (VCO) 406 (e.g., a digitally controlled oscillator) as is well-known in the art.

In related aspects, the PLL 400 may include a charge pump 402. The charge pump 402 may be coupled to a loop filter 404 (e.g., a low pass filter). The loop filter 404 may be coupled to the VCO 406. The VCO 406 may be coupled to a frequency divider (N divider) 408. The frequency divider (N divider) 408 may be coupled back to the charge pump 402 through a first mixer 420.

The noise transfer function may be expressed as:

$$NTF_{VDD}(s) = \frac{\theta_{out}}{VDD(s)} = \frac{\frac{2\pi K_{VCO\_VDD}}{s}}{1 + LG}$$

where LG is the loop gain, and s is a complex frequency parameter such as for Laplace transforms.

The phase noise caused by the power supply noise may be quantitatively measured by the power supply noise rejection (PSNR), which may be expressed as:

$$PSNR = 20\log10\left(\frac{\Delta V_{DD}}{2} \cdot NTF_{VDD}(s) \cdot \frac{T}{2\pi} \cdot \frac{1}{T \cdot \Delta V_{DD}}\right) = 20\log10\left(\frac{1}{4\pi} \cdot NTF_{VDD}(s)\right)$$

where T is the PLL output clock period.

Figure 5:
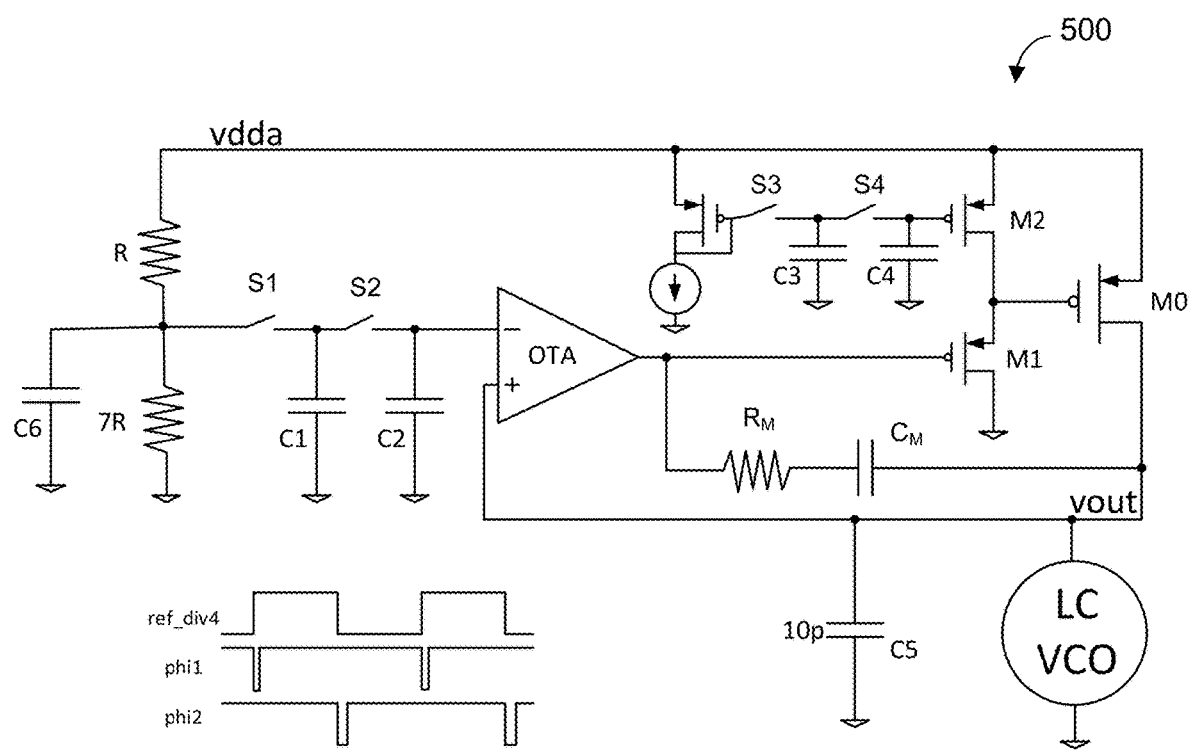
FIG. 5 is a block diagram illustrating a low-dropout regulator (LDO) according to aspects of the present disclosure.

FIG. 5 is a block diagram illustrating an exemplary low-dropout regulator (LDO) 500 (e.g., a voltage regulator) according to aspects of the present disclosure. The LDO 500 may be implemented with or as a part of the PLL 400 of FIG. 4 (e.g., LDO 412). The LDO 500 may include different voltage regulation paths for reducing PLL noise based on a frequency of operation. By way of example only, the LDO 500 includes three voltage regulation paths for reducing PLL noise (e.g., power supply noise). For instance, the LDO 500 may include a first path (e.g., a low pass filter) that is operational at a low frequency. The first path may be used to generate a band limited reference voltage from a supply voltage VDDA. In some aspects, the reference voltage may be generated from an external reference source. Alternatively, the reference voltage may be generated from a bandgap reference. It is noted that VDDA may be the same as VDD discussed previously, or may be a different supply voltage.

The first path may include a resistor ladder R and 7R (e.g., a divider) and switches S1 (e.g., a first switch) and S2 (e.g., a second switch). In an aspect of the disclosure, switch S1 is clocked by clock phi1 and switch S2 is clocked by clock phi2. The switches S1 and S2 may be operated according to a low duty-cycle for charging capacitors C1 (e.g., a first capacitor) and C2 (e.g., a second capacitor) according to a clock (e.g., clock phi1 or phi2) for coupling the supply voltage VDDA to the LDO output Vout. The LDO 500 output may move along the first path by capacitors C1 and C2 based on the operation of the low duty-cycle pulsed switches S1 and S2 with the supply voltage VDDA at a direct current, while its power supply rejection ratio (PSRR) is a low-pass filtered transfer function or a high pass filtered transfer function.

The LDO 500 may also include a second path (e.g., a feedback loop). The second path may include an amplifier (e.g., an operational transconductance amplifier (OTA) as shown in FIG. 5) coupled to a first transistor M1 (e.g., a source follower), and a passing transistor M0. The second path may be operational at a low frequency due to bandwidth limitations associated with the OTA. The OTA may control the passing transistor M0 in the second path. In some aspects, the PSRR may be a high-pass filtered transfer function. For example, the PSRR of the second path is high-pass filtered transfer function, and its corner frequency is determined by the feedback loop bandwidth.

In some aspects, the band limited reference voltage generated by the first path may be combined with the second path to provide the band reject power supply rejection ratio (PSRR). For example, the output of the amplifier may be coupled to an input of the amplifier to create a feedback path for combining with the first path. In some aspects, a PSRR zero value may be created when the PSRR of the first path and the second path are approximately equal. For instance, when the PSRR of the first path and the second path are close, they may be out of phase (e.g., exactly out of phase). As a result, they may cancel each other and create a notch in the overall PSRR plot. This notch may define a band reject region and is illustrated graphically, by way of example only, in FIGS. 6 and 7.

In some aspects, the input of the LDO 500 may be derived directly from the supply voltage VDDA by the resistor ladder R and 7R. For example, the output of the resistor ladder R and 7R may be low pass filtered before being processed by the OTA. Capacitors C1 and C2, and their corresponding switches S1 and S2 may be controlled by a low duty cycle clock. The low duty cycle clock may greatly reduce the low pass corner frequency without using a large resistor or capacitor.

The LDO 500 may include a third path (e.g., a feedforward path). The third path may be operational at a high frequency. The third path includes the first transistor M1, a second transistor M2, and the passing transistor M0 for extending the band reject PSRR. The third path may further enhance the noise reduction generated by the first and second paths by improving the band reject PSRR during a high frequency. For example, the band reject region may be enhanced by a low duty cycle switched-capacitor filter at the low frequency side of the PSRR for the first and second paths, and at the high frequency side of the PSRR for the third path.

In some aspects, the third path may only be operational at a high frequency because both the gate and source of transistor M2 follow the supply voltage VDDA. For example, at low frequencies, switches S3 (e.g., a third switch) and S4 (e.g., a fourth switch) that correspond to capacitors C3 (e.g., a third capacitor) and C4 (e.g., a fourth capacitor) may couple the gate of the second transistor M2 to the supply voltage VDDA. In an aspect of the disclosure, switch S3 is clocked by clock phi1 and switch S4 is clocked by clock phi2. Also, the impedance looking into the source of transistor M1 may be very small, due to the OTA loop gain. Additionally, at high frequencies, the low-pass filter including the capacitors C3 and C4 decouples the gate of transistor M2 from the supply voltage VDDA, while the source of the transistor M2 may track the supply voltage VDDA.

In some aspects, at a high enough frequency, the OTA loop has no gain, and the impedance looking into the source of the transistor M1 may be gm1. For example, gm1 may be the small-signal transconductance of M1, defined as the quotient of the transistor drain current change divided by the transistor gate voltage change. Therefore, if the transistors M1 and M2 are similar sizes, the gain from the supply voltage VDDA to the gate of the passing transistor M0 may be 1. This feedforward gain makes both the gate and the source of the transistor M0 track the supply voltage VDDA, thus providing good PSRR at high frequency. For example, the feedback loop has no gain, and the gain from the supply voltage VDDA to the gate of passing transistor M0 may be 1. The high frequency PSRR may be further improved if more current is allowed for the transistors M1 and M2.

In some aspects, the first path and second path may define a band reject region for reducing the VDDA noise at the LDO output Vout during low frequency. The third path may further define the band reject region for reducing the VDDA noise at the LDO output Vout during high frequency.

In some aspects, the noise at the supply voltage VDDA may be equal to the noise at the gate of the passing transistor M0. When the noise at the supply voltage VDDA is equal to the noise at the gate of the passing transistor M0, the gate to source voltage, Vgs. of M0 will remain constant, causing PSRR to be improved. If Vgs increases, then the noise would increase as well.

An advantage is that the source-follower of the transistor M1 gives another Vgs voltage drop from the supply voltage VDDA. As a result, the OTA output will have two times (2×) Vgs from the supply voltage VDDA, which is very helpful to keep the OTA PMOS folding cascode transistors in a saturation region across process-voltage-temperature (PVT) corners. Given the high input OTA common mode voltage, an NMOS input pair may be used. As a result, the OTA may include a PMOS cascode as the current folding transistor. In some aspects, the OTA may not include a cascode transistor in the NMOS side. In some aspects, the OTA feedback loop may be compensated by a Miller capacitance, for example. The Miller capacitance may be used to stabilize a feedback loop and may, for instance be implemented with resistor $R_M$ and capacitor $C_M$ as shown in FIG. 5. The feedforward path may not affect the feedback loop stability.

The clock (e.g., a low duty cycle clock) may be defined by a reference clock ref_div4 (e.g., a value of reference clock generator circuit divided by 4, it is noted that dividing by other values is possible). A drop in phi1, causing the corresponding switches S1 or S3 to close briefly, may be defined by a rising edge in the reference clock ref_div4. A drop in phi2, causing the corresponding switches S2 or S4 to close briefly, may be defined by a falling edge in reference clock ref_div4. Otherwise, the switches S1-S4 may be in an open position. By defining the clock this way, the switches S1-S4 alternatingly close for brief periods, causing a charge to be passed along the capacitors to improve the low pass filter performance by not allowing the charge to settle.

The LDO 500 may further include a capacitor C6 that adds a filter to the resistor ladder R and 7R, for further limiting VDDA noise. Decoupling capacitor C5 may decouple the LDO output voltage Vout by dividing the high frequency current by the decoupling capacitor C5.

In some aspects, the LDO 500 may be implemented without an external clean reference voltage. For example, the LDO 500 may include a divider and a low pass filter to generate a reference voltage from the supply voltage VDDA.

In some aspects, the forward path (e.g., the first path) may have a low pass power supply rejection ratio (PSRR) response, the feedback path (e.g., the second path) may have a high pass power supply rejection ratio (PSRR) response, and the feedforward path (e.g., the third path) may have a high pass PSRR response.

In some aspects, a first PMOS (e.g., transistor M1) may couple the forward path (e.g., the first path) to an output passing PMOS (e.g., passing transistor M0). In some aspects, a second PMOS (e.g., transistor M2) may couple the feedforward path (e.g., the third path) to the output passing PMOS.

Figure 6:
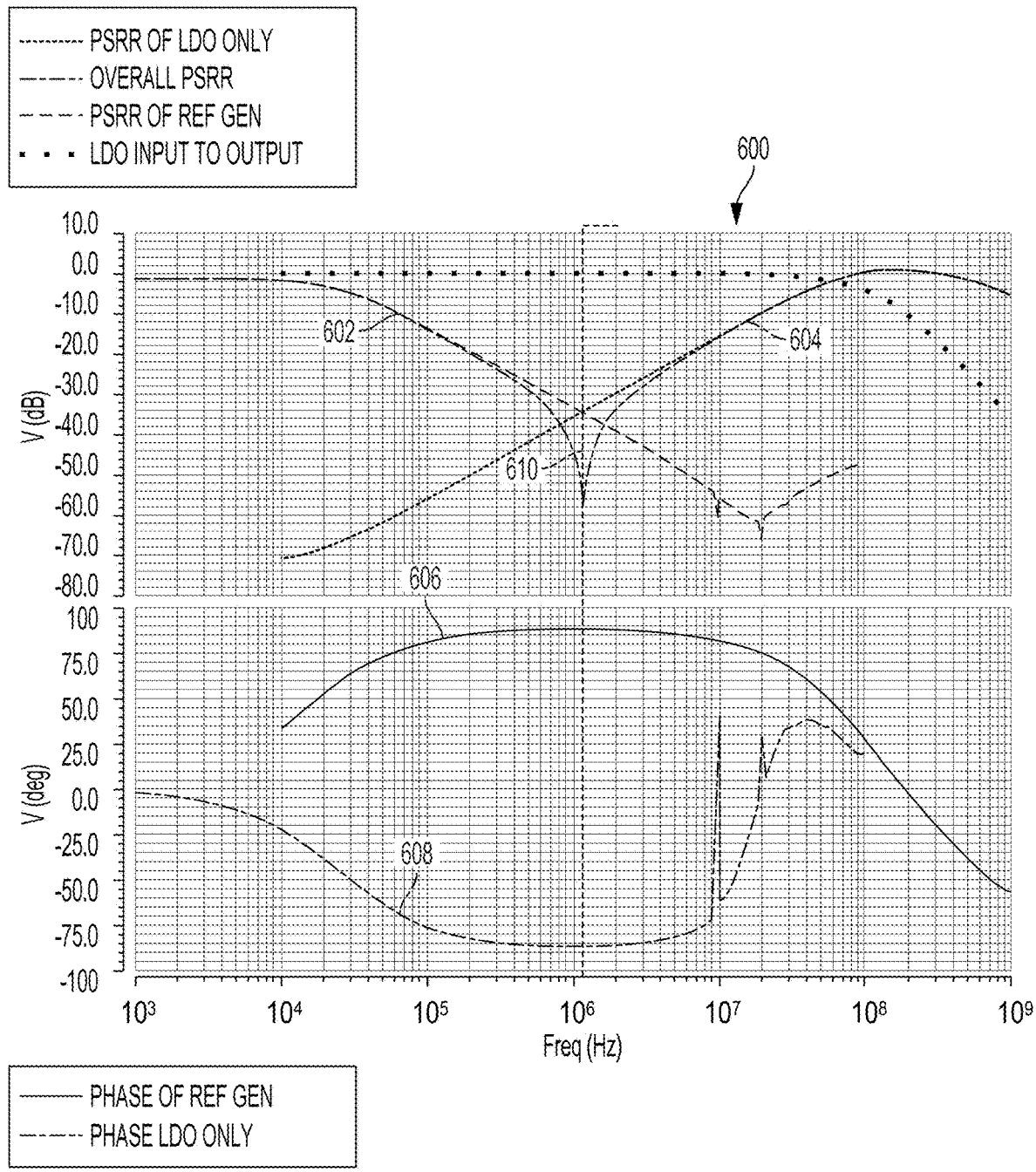
FIG. 6 is a power supply rejection ratio (PSRR) chart and phase diagram for a low-dropout regulator (LDO) according to aspects of the present disclosure.

FIG. 6 is an exemplary power supply rejection ratio (PSRR) chart and phase diagram 600 for a low-dropout regulator (LDO) according to aspects of the present disclosure. The PSRR chart of FIG. 6 is presented by way of example only and for ease of understanding. A low pass filter curve 602 may be generated by the first path as illustrated in FIG. 5. A high pass filter curve 604 may be generated by the second path as illustrated in FIG. 5. A low pass filter phase diagram 608 and a high pass filter phase diagram 606 illustrate that the phases of the first path and the second path may be about 180 degrees out of phase when the gains are equal (e.g., exactly out of phase). At this point, the PSRR of the low pass filter curve 602 and the high pass filter curve 604 cancel each other out and form a notch 610, representing a zero PSRR. The notch 610 (e.g., a band reject region) is applied to the band-pass noise transfer function of the VCO at Vout in order to reduce the noise. Of course, the frequency, gain and PSRR values shown in FIG. 6 are merely exemplary and not limiting.

Figure 7:
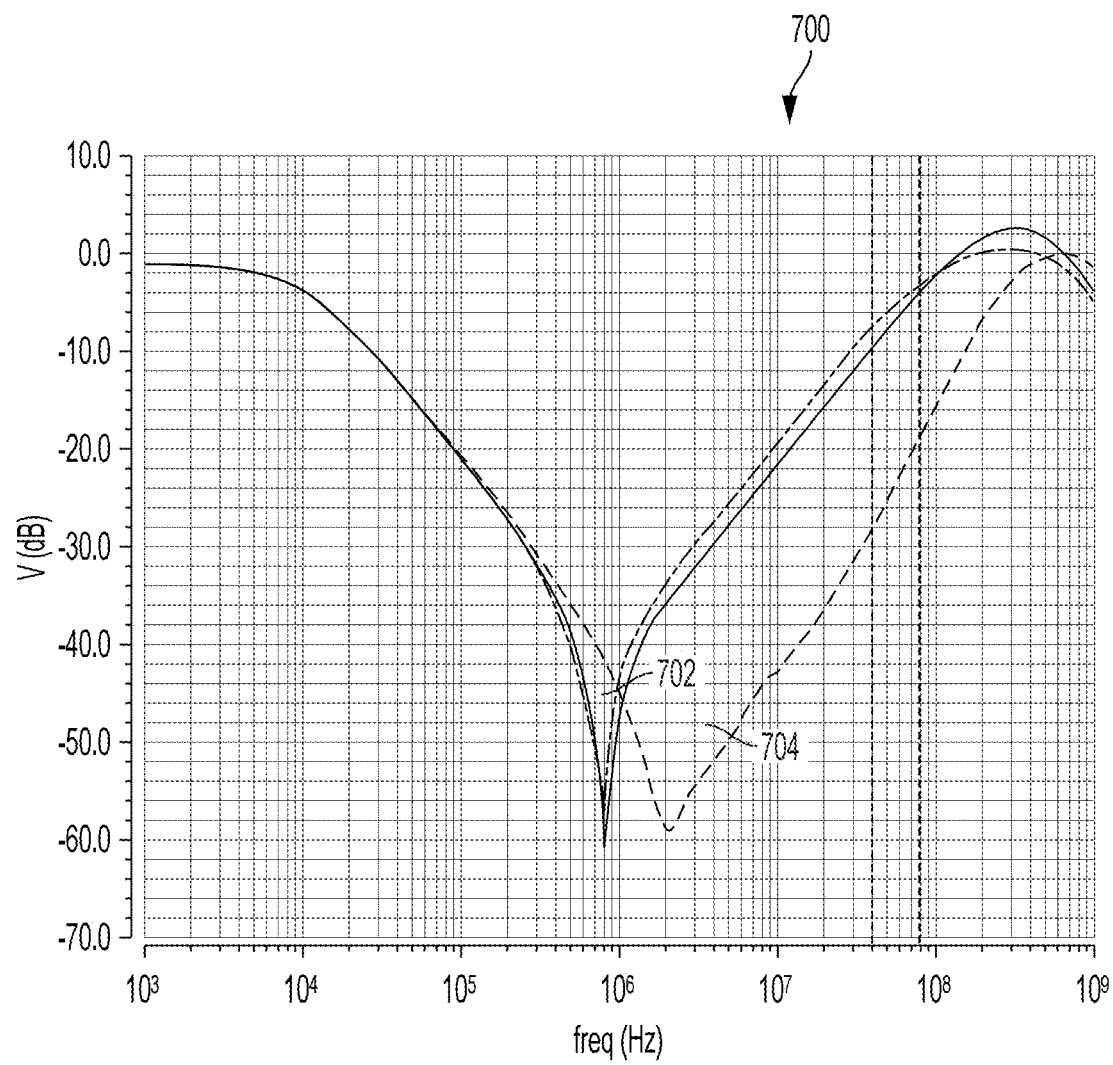
FIG. 7 is a power supply rejection ratio (PSRR) chart according to aspects of the present disclosure.

FIG. 7 is a power supply rejection ratio (PSRR) chart 700 according to aspects of the present disclosure. The PSRR chart of FIG. 7 is presented by way of example only and for ease of understanding. The frequency, gain and PSRR values shown in FIG. 7 are merely exemplary and not limiting. A first notch 702 (e.g., a band reject region) may be generated by the first path and the second path as described above in FIGS. 5 and 6. A second notch 704 (e.g., a shifted band reject region) may be shifted to the right from the first notch 702, and may be generated by adding in the third path (e.g., a feedforward path) from FIG. 5. The third path may be a high pass filter, and only operable during high frequencies. The second notch 704 illustrates how the first notch 702 may be modified by the third path. In this way, the first notch 702 may be fine-tuned by the third path to generate the second notch 704 for the purposes of band rejection to reduce noise.

Figure 8:
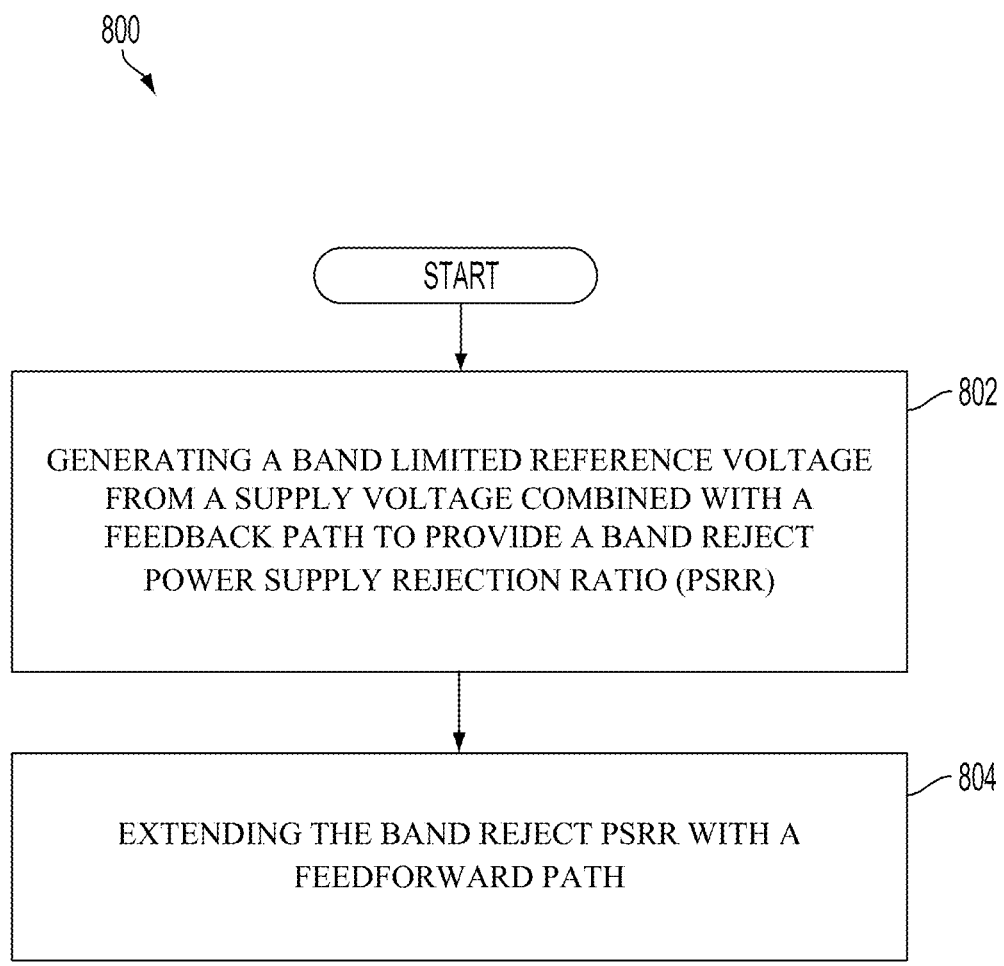
FIG. 8 is a process flow diagram illustrating a method for reducing noise in a phase locked loop (PLL) according to an aspect of the present disclosure.

FIG. 8 is a process flow diagram illustrating a method 800 for reducing noise in a phase locked loop (PLL) according to an aspect of the present disclosure. At block 802, a band limited reference voltage is generated from a supply voltage combined with a feedback path to provide a band reject power supply rejection ratio (PSRR). At block 804, the band reject PSRR is extended with a feedforward path.

According to a further aspect of the present disclosure, an apparatus for removing noise using a voltage regulator (e.g., a low-dropout regulator (LDO)) includes a means for generating a band limited reference voltage from a supply voltage combined with a feedback path to provide a band reject power supply rejection ratio (PSRR). The reference voltage generating means may be the control unit 210, as shown in FIGS. 2 and 3 and a local oscillator (not shown). The apparatus may also include means for extending the band reject PSRR with a feedforward path. The means for extending may be the control unit 210, as shown in FIGS. 2 and 3 and a local oscillator (not shown). In another aspect, the aforementioned means may be any layer, module, or any apparatus configured to perform the functions recited by the aforementioned means.

Figure 9:
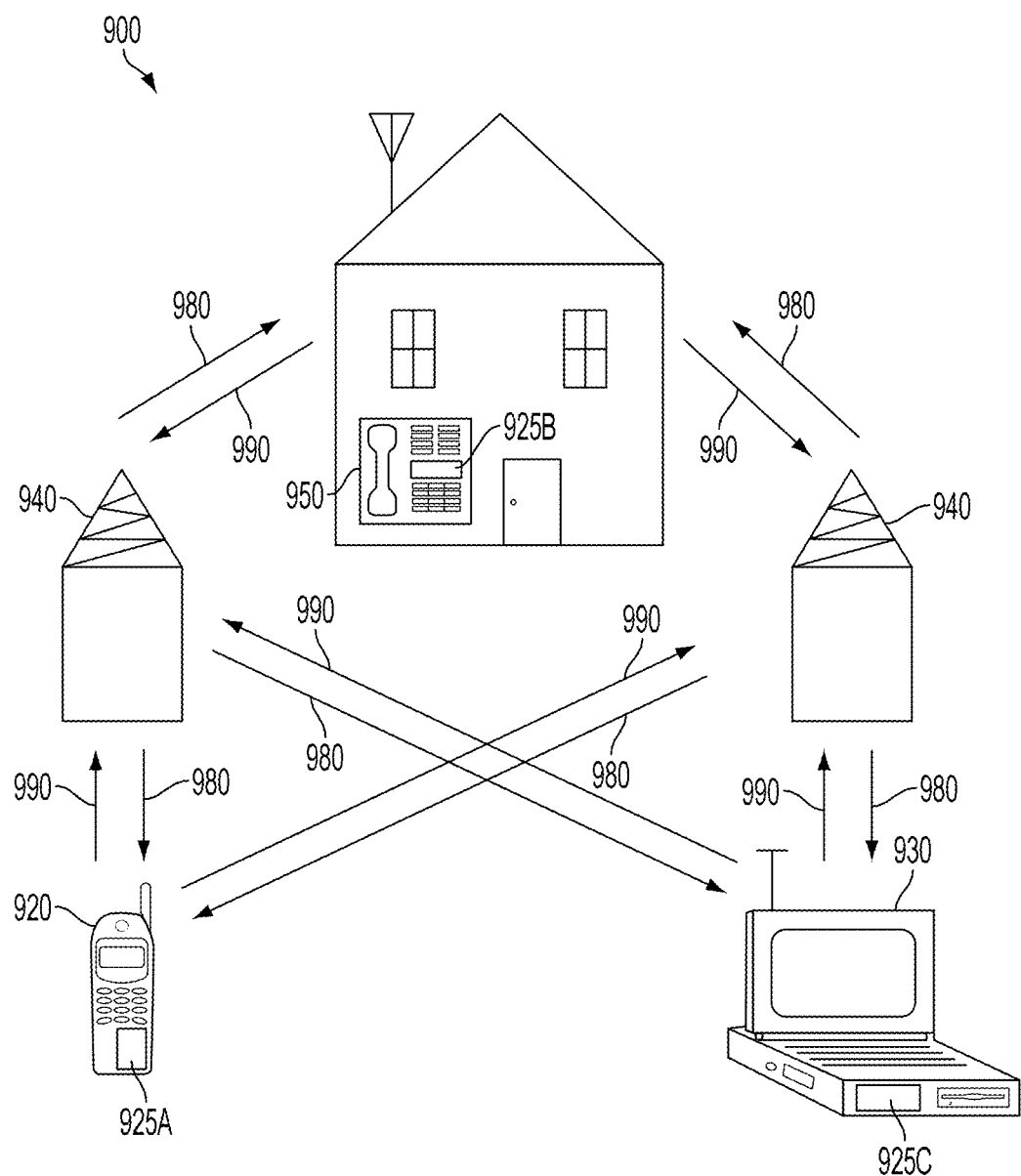
FIG. 9 is a block diagram showing an exemplary wireless communication system in which an aspect of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C, and 925B that include the disclosed LDO. It will be recognized that other devices may also include the disclosed LDO, such as the base stations, user equipment, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed LDO.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. Accordingly, the scope of the present disclosure is intended to be defined only by reference to the appended claims.

What is claimed is:

1. A voltage regulator comprising:
a first path configured to generate a band-limited reference voltage from a supply voltage;
a feedback path configured to generate a feedback voltage that is combined with the band-limited reference voltage to provide an output of an operational transconductance amplifier (OTA) in the feedback path;
a feedforward path comprising at least a first switch and a second switch and comprising a feedforward path transistor having a gate selectively connected to the supply voltage of the first path through the first switch and the second switch, a first transistor having a source connected to a drain of the feedforward path transistor, and a passing transistor having a source connected to the supply voltage of the first path, a gate of the passing transistor connected to the drain of the feedforward path transistor and the source of the first transistor; and
an output of the voltage regulator coupled to the output of the operational transconductance amplifier, a drain of the passing transistor connected to the output of the voltage regulator.

2. The voltage regulator of claim 1, in which the feedback path comprises the output of the OTA coupled to a gate of the first transistor and the passing transistor.

3. The voltage regulator of claim 1, in which the feedback path is operational at a low frequency due to bandwidth limitation of the operational transconductance amplifier.

4. The voltage regulator of claim 1, in which the feedforward path further includes at least two capacitors selectively coupled to the first switch and the second switch.

5. The voltage regulator of claim 4, in which the feedforward path is operational at a high frequency when the gate of the feedforward path transistor is coupled to the supply voltage of the first path through the first switch and the second switch.

6. The voltage regulator of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

7. A voltage regulator circuit comprising:
a divider and a low pass filter to generate a reference voltage from a supply voltage;
a feedback path configured to generate a feedback voltage that is combined with the reference voltage to provide an output of an operational transconductance amplifier (OTA) in the feedback path;
a feedforward path comprising at least two switches, a feedforward path transistor having a gate selectively connected to the supply voltage of a first path through the at least two switches, a first transistor having a source connected to a drain of the feedforward path transistor, and a passing transistor, a source of the passing transistor connected to the supply voltage a gate of the passing transistor connected to the drain of the feedforward path transistor and the source of the first transistor; and
an output of the voltage regulator circuit coupled to the output of the operational transconductance amplifier, a drain of the passing transistor connected to the output of the voltage regulator circuit.

8. The voltage regulator circuit of claim 7, further comprising a voltage controlled oscillator (VCO).

9. The voltage regulator circuit of claim 7, in which the divider comprises a resistor ladder and has a low pass power supply rejection ratio (PSRR) response.

10. The voltage regulator circuit of claim 7, in which the feedback path comprises the output of the OTA coupled to a gate of the first transistor and the passing transistor, and has a high pass power supply rejection ratio (PSRR) response.

11. The voltage regulator circuit of claim 7, in which the feedforward path further includes at least two capacitors selectively coupled to the first switch and the second switch, and has a high pass power supply rejection ratio (PSRR) response.

12. The voltage regulator circuit of claim 7, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

13. A method of removing noise with a voltage regulator comprising:

generating a band-limited reference voltage from a first path supply voltage combined with a feedback voltage generated by a feedback path to provide an output of an operational transconductance amplifier (OTA) in the feedback path;
extending a band reject power supply rejection ratio (PSRR) with a feedforward path including a feedforward path transistor having a gate selectively connected to the first path supply voltage through a first switch and a second switch, a first transistor having a source connected to a drain of the feedforward path transistor, and a passing transistor having a source connected to the first path supply voltage, a gate of the passing transistor connected to the drain of the feedforward path transistor and the source of the first transistor, an output of the voltage regulator coupled to the output of the operational transconductance amplifier, a drain of the passing transistor connected to the output of the voltage regulator;
controlling by at least one clock of the first switch and the second switch in the feedforward path and
selectively connected the feedforward path transistor to the supply voltage of the first path through the first switch and the second switch.

14. The method of claim 13, in which the feedback path is operational at a low frequency due to bandwidth limitation of the operational transconductance amplifier.

15. The method of claim 13, in which the feedforward path is operational at a high frequency when the gate of a feedforward path transistor of the feedforward path is coupled to the first path supply voltage through the first switch and the second switch.

16. An apparatus for removing noise using a voltage regulator comprising:
means for generating a band-limited reference voltage from a first path supply voltage combined with a feedback voltage generated by a feedback path to provide an output of an operational transconductance amplifier (OTA) in the feedback path;
means for extending a band reject power supply rejection ratio (PSRR) with a feedforward path comprising at least two switches and comprising a feedforward path transistor having a gate selectively coupled to the first path supply voltage through a first switch and a second switch, a first transistor having a source coupled to a drain of the feedforward path transistor, and a passing transistor having a source coupled to the first path supply voltage, a gate of the passing transistor coupled to the drain of the feedforward path transistor and the source of the first transistor; and
an output of the voltage regulator coupled to the output of the operational transconductance amplifier, a drain of the passing transistor coupled to the output of the voltage regulator.

* * * * *